(12) United States Patent
Lin

(10) Patent No.: US 12,082,475 B2
(45) Date of Patent: Sep. 3, 2024

(54) DISPLAY PANEL AND METHOD FOR FABRICATING SAME

(71) Applicant: Shenzhen China Star Optoelectronics Semiconductor Display Technology Co., Ltd., Shenzhen (CN)

(72) Inventor: Gaobo Lin, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/055,659

(22) PCT Filed: Sep. 23, 2020

(86) PCT No.: PCT/CN2020/116977
§ 371 (c)(1),
(2) Date: Nov. 16, 2020

(87) PCT Pub. No.: WO2022/047851
PCT Pub. Date: Mar. 10, 2022

(65) Prior Publication Data
US 2023/0189570 A1    Jun. 15, 2023

(30) Foreign Application Priority Data
Sep. 3, 2020 (CN) .......................... 202010913140.3

(51) Int. Cl.
*H10K 59/80* (2023.01)
*H10K 59/12* (2023.01)
*H10K 59/122* (2023.01)
*H10K 71/00* (2023.01)

(52) U.S. Cl.
CPC ... *H10K 59/80522* (2023.02); *H10K 59/1201* (2023.02); *H10K 59/122* (2023.02); *H10K 59/80515* (2023.02); *H10K 59/80521* (2023.02); *H10K 59/873* (2023.02); *H10K 59/8792* (2023.02); *H10K 71/00* (2023.02)

(58) Field of Classification Search
CPC ................................. H10K 59/80522
See application file for complete search history.

(56) References Cited

U.S. PATENT DOCUMENTS

| 2007/0194379 | A1* | 8/2007 | Hosono | H01L 29/78693 |
| | | | | 257/347 |
| 2016/0043341 | A1* | 2/2016 | Heo | H10K 59/122 |
| | | | | 257/40 |
| 2017/0317154 | A1* | 11/2017 | Heo | H10K 59/1315 |
| 2018/0366533 | A1 | 12/2018 | Lee et al. | |

(Continued)

FOREIGN PATENT DOCUMENTS

| CN | 106486606 A | 3/2017 |
| CN | 106876426 A | 6/2017 |

(Continued)

*Primary Examiner* — Peter M Albrecht
(74) *Attorney, Agent, or Firm* — Nathan & Associates; Menachem Nathan

(57) ABSTRACT

A display panel and a method for fabricating the same are provided. In the display panel, an undercut structure is formed below a second auxiliary electrode, so that a cathode electrode and a first auxiliary electrode have an overlapping region, and the cathode electrode and the first auxiliary electrode are connected.

17 Claims, 6 Drawing Sheets

(56) References Cited

U.S. PATENT DOCUMENTS

| | | | |
|---|---|---|---|
| 2019/0115403 A1* | 4/2019 | Kang | H10K 59/131 |
| 2020/0135838 A1* | 4/2020 | Han | H10K 59/1315 |
| 2020/0185480 A1 | 6/2020 | Heo | |
| 2020/0212162 A1 | 7/2020 | Fan | |
| 2021/0408441 A1* | 12/2021 | Lee | H10K 59/1315 |

FOREIGN PATENT DOCUMENTS

| | | |
|---|---|---|
| CN | 107342304 A | 11/2017 |
| CN | 109599502 A | 4/2019 |
| CN | 109671739 A | 4/2019 |
| WO | 2007142603 A1 | 12/2007 |

* cited by examiner

DISPLAY PANEL AND METHOD FOR FABRICATING SAME

FIELD OF INVENTION

The present disclosure relates to the technical field of display, and particularly to a display panel and a method for fabricating the same.

BACKGROUND

In a current top-emitting organic light-emitting diode display panel, in order to increase its transmittance, a thickness of a metal cathode electrode is thinner, resulting in greater sheet resistance and serious IR-drop. This makes the display panel have significantly uneven brightness, which seriously affects display effect of the display panel.

SUMMARY OF DISCLOSURE

The present disclosure provides a display panel and a method for fabricating the same to solve the technical problem of greater sheet resistance and serious IR-drop due to a thinner thickness of a cathode electrode in a current organic light-emitting diode display panel.

The present disclosure provides a display panel comprising:
- an array substrate comprising a source electrode, a drain electrode, a first auxiliary electrode, and a protective layer disposed on the first auxiliary electrode, wherein the first auxiliary electrode, the source electrode, and the drain electrode are formed of a same material on a same layer;
- a second auxiliary electrode disposed on the protective layer and connected to the first auxiliary electrode;
- an undercut structure formed on the protective layer, extending to directly below the second auxiliary electrode, and exposing the first auxiliary electrode;
- a flat layer disposed on the second auxiliary electrode and the protective layer;
- an anode electrode disposed on the flat layer;
- a pixel defining layer disposed on the anode electrode and the flat layer, and provided with a first opening connected to the undercut structure;
- an organic light-emitting layer disposed on the pixel defining layer and not completely covering an exposed part of the first auxiliary electrode; and
- a cathode electrode disposed on the organic light-emitting layer, extending into the undercut structure, and connected to the first auxiliary electrode.

In an embodiment, the cathode electrode is connected to the second auxiliary electrode through the undercut structure.

In an embodiment, the protective layer is provided with a first via hole exposing the first auxiliary electrode, and the second auxiliary electrode extends into the first via hole and is connected to the first auxiliary electrode. The flat layer is provided with a second via hole exposing the source electrode, and the anode electrode extends into the second via hole and is connected to the source electrode. The pixel defining layer is provided with a second opening that exposes the anode electrode, and the organic light-emitting layer extends into the second opening.

In an embodiment, the array substrate further comprises: a base substrate; a light-shielding metal layer and a first electrode plate disposed on the base substrate; a buffer layer disposed on the light-shielding metal layer; and an amorphous oxide semiconductor layer and a second electrode plate disposed on the buffer layer. The first electrode plate and the second electrode plate form a capacitor structure.

In an embodiment, the undercut structure has a depth into the second auxiliary electrode of 0.1 μm to 5 μm.

In an embodiment, the second auxiliary electrode has a thickness of 500 angstroms to 20000 angstroms.

In an embodiment, the anode electrode is a single layer structure or a composite layer structure.

The present disclosure further provides a display panel comprising:
- an array substrate comprising a first auxiliary electrode and a protective layer disposed on the first auxiliary electrode;
- a second auxiliary electrode disposed on the protective layer and connected to the first auxiliary electrode;
- an undercut structure formed on the protective layer, extending to directly below the second auxiliary electrode, and exposing the first auxiliary electrode;
- a flat layer disposed on the second auxiliary electrode and the protective layer;
- an anode electrode disposed on the flat layer;
- a pixel defining layer disposed on the anode electrode and the flat layer, and provided with a first opening connected to the undercut structure;
- an organic light-emitting layer disposed on the pixel defining layer and not completely covering an exposed part of the first auxiliary electrode; and
- a cathode electrode disposed on the organic light-emitting layer, extending into the undercut structure, and connected to the first auxiliary electrode.

In an embodiment, the cathode electrode is connected to the second auxiliary electrode through the undercut structure.

In an embodiment, the array substrate further comprises a source electrode and a drain electrode disposed on a same layer as the first auxiliary electrode.

In an embodiment, the protective layer is provided with a first via hole exposing the first auxiliary electrode, and the second auxiliary electrode extends into the first via hole and is connected to the first auxiliary electrode. The flat layer is provided with a second via hole exposing the source electrode, and the anode electrode extends into the second via hole and is connected to the source electrode. The pixel defining layer is provided with a second opening that exposes the anode electrode, and the organic light-emitting layer extends into the second opening.

In an embodiment, the undercut structure has a depth into the second auxiliary electrode of 0.1 μm to 5 μm.

In an embodiment, the anode electrode is a single layer structure or a composite layer structure.

In an embodiment, the second auxiliary electrode has a thickness of 500 angstroms to 20000 angstroms.

The present disclosure further provides a method for fabricating a display panel. The method comprises:
- forming a patterned second auxiliary electrode on an array substrate, wherein the array substrate comprises a first auxiliary electrode and a protective layer disposed on the first auxiliary electrode, the protective layer is provided with a first via hole exposing the first auxiliary electrode, and the second auxiliary electrode extends into the first via hole and is connected to the first auxiliary electrode;
- forming an undercut structure in a region of the protective layer corresponding to the first auxiliary electrode, wherein the undercut structure extends to directly below the second auxiliary electrode and exposes the first auxiliary electrode;

forming a flat layer on the protective layer;

forming an anode electrode on the flat layer;

forming a pixel defining layer on the anode electrode, wherein the pixel defining layer is provided with a first opening connected to the undercut structure;

forming an organic light-emitting layer on the pixel defining layer, wherein the organic light-emitting layer does not completely cover an exposed part of the first auxiliary electrode; and forming a cathode electrode on the organic light-emitting layer, wherein the cathode electrode extends into the undercut structure and is connected to the first auxiliary electrode.

In an embodiment, the step of forming the undercut structure in the region of the protective layer corresponding to the first auxiliary electrode comprises:

forming a photoresist layer on the protective layer, wherein the photoresist layer is provided with a notch corresponding to an area where the undercut structure is to be formed, and the notch exposes the protective layer;

etching the protective layer to form the undercut structure; and removing the photoresist layer.

In an embodiment, the step of forming the organic light-emitting layer on the pixel defining layer comprises:

shielding a part of the undercut structure directly below the second auxiliary electrode with the second auxiliary electrode in a direction of a first set angle; and forming the organic light-emitting layer on the pixel defining layer, wherein the organic light-emitting layer extends into a part of the undercut structure that is not shielded by the second auxiliary electrode.

In an embodiment, in the step of forming the cathode electrode on the organic light-emitting layer, the cathode electrode extends into the undercut structure and is connected to the exposed part of the first auxiliary electrode.

In an embodiment, the step of forming the cathode electrode on the organic light-emitting layer comprises:

forming a continuous cathode electrode on the organic light-emitting layer, wherein the cathode electrode extends into the undercut structure and is connected to the exposed part of the first auxiliary electrode and an exposed part of the second auxiliary electrode.

In an embodiment, the array substrate further comprises a source electrode and a drain electrode disposed on a same layer as the first auxiliary electrode. The flat layer is provided with a second via hole exposing the source electrode. The anode electrode extends into the second via hole and is connected to the source electrode. The pixel defining layer is provided with a second opening that exposes the anode electrode. The organic light-emitting layer extends into the second opening.

In the display panel and the method for fabricating the same of the present disclosure, the undercut structure is formed below the second auxiliary electrode, so that the subsequently formed cathode electrode and the first auxiliary electrode have an overlapping region, thereby improving IR-drop of the display panel.

BRIEF DESCRIPTION OF DRAWINGS

In order to more clearly illustrate technical solutions in embodiments of the present disclosure, a brief description of accompanying drawings used in the embodiments will be given below. The accompanying drawings in the following description are merely some embodiments of the present disclosure. For those skilled in the art, other drawings may be obtained from these accompanying drawings without creative labor.

DETAILED DESCRIPTION

Figure 1:
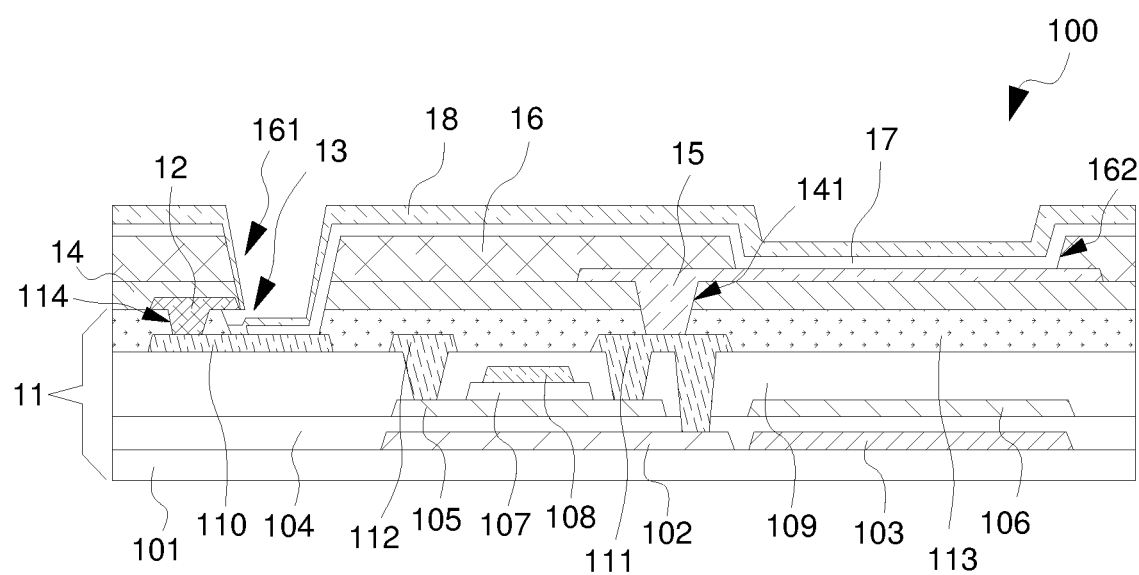
FIG. 1 is a schematic structural diagram of a display panel according to an embodiment of the present disclosure.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Please refer to FIG. 1, which is a schematic structural diagram of a display panel according to an embodiment of the present disclosure.

The present disclosure provides a display panel 100 comprising an array substrate 11, a second auxiliary electrode 12, an undercut structure 13, a flat layer 14, an anode electrode 15, a pixel defining layer 16, an organic light-emitting layer 17, and a cathode electrode 18.

Specifically, the array substrate 11 comprises a base substrate 101, a light-shielding metal layer 102, a first electrode plate 103, a buffer layer 104, an amorphous oxide semiconductor layer 105, a second electrode plate 106, a gate insulating layer 107, a first metal conductive layer 108, a shield insulating layer 109, a first auxiliary electrode 110, a source electrode 111, a drain electrode 112, and a protective layer 113. The light-shielding metal layer 102 and the first electrode plate 103 are disposed on the base substrate 101. The buffer layer 104 is disposed on the light-shielding metal layer 102. The amorphous oxide semiconductor layer 105 and the second electrode plate 106 are disposed on the buffer layer 104. The gate insulating layer 107, the first metal conductive layer 108, and the shield insulating layer 109 are sequentially disposed on the amorphous oxide semiconductor layer 105. The shield insulating layer 109 covers the amorphous oxide semiconductor layer 105, the second electrode plate 106, the gate insulating layer 107, and the first metal conductive layer 108. The first auxiliary electrode 110, the source electrode 111, and the drain electrode 112 are disposed on the shield insulating layer 109. The protective layer 113 is disposed on the shield insulating layer 109, the first auxiliary electrode 110, the source electrode 111, and the drain electrode 112. The first electrode plate 103 and the second electrode plate 106 form a capacitor structure.

The second auxiliary electrode 12 is disposed on the protective layer 113 and connected to the first auxiliary electrode 110.

The undercut structure 13 is formed on the protective layer 113 and extends to directly below the second auxiliary electrode 12. The undercut structure 13 exposes the first auxiliary electrode 110.

The flat layer 14 is disposed on the second auxiliary electrode 12 and the protective layer 113.

The anode electrode 15 is disposed on the flat layer 14.

The pixel defining layer 16 is disposed on the anode electrode 15 and the flat layer 14. The pixel defining layer 16 is provided with a first opening 161 connected to the undercut structure 13.

The organic light-emitting layer 17 is disposed on the pixel defining layer 16. The organic light-emitting layer 17 does not completely cover an exposed part of the first auxiliary electrode 110. Specifically, the organic light-emitting layer 17 extends into the undercut structure 13 and covers a part of the exposed first auxiliary electrode 110.

The cathode electrode 18 is disposed on the organic light-emitting layer 17. The cathode electrode 18 is connected to the first auxiliary electrode 110 through the undercut structure 13. In this embodiment, specifically, the cathode electrode 18 extends into the undercut structure 13 and is connected to the exposed part of the first auxiliary electrode 110. The cathode electrode 18 may be connected to the first auxiliary electrode 110 in other ways, for example, to other parts of the first auxiliary electrode 110.

In the display panel 100 of this embodiment, the undercut structure 13 is formed below the second auxiliary electrode 12, so that the subsequently formed cathode electrode 18 and the first auxiliary electrode 110 have an overlapping region, that is, the cathode electrode 18 and the first auxiliary electrode 110 are connected, thereby improving IR-drop of the display panel 100.

On one hand, the second auxiliary electrode 12 and the first auxiliary electrode 110 are connected to form an auxiliary electrode combination. An area of the auxiliary electrode combination is increased to improve an effect of improving IR-drop. On the other hand, the second auxiliary electrode 12 provides direct support for an upper part of the undercut structure 13 to facilitate better formation of the subsequent layers and a partition mentioned below.

Optionally, the second auxiliary electrode 12 may be a single metal layer, such as Mo, Al, Cu, or Ti, or may be a multilayer structure, such as Mo/Al/Mo, Al/Mo, Mo/Cu, or Mo/Ti/Cu, but is not limited to the above materials. Furthermore, the second auxiliary electrode 12 has a thickness of 500 angstroms to 20000 angstroms, such as 500 angstroms, 1000 angstroms, 2000 angstroms, 5000 angstroms, 10000 angstroms, and 20000 angstroms.

Specifically, in this embodiment, the undercut structure 13 is configured to make the second auxiliary electrode 12, the flat layer 14, and the pixel defining layer 16 stacked in a region corresponding to the undercut structure 13 form a partition. The partition causes the subsequent formed organic light-emitting layer 17 to be disconnected at the partition, thereby making the organic light-emitting layer 17 discontinuous. This provides a basis for the subsequent formed cathode electrode 18 to be directly connected to the first auxiliary electrode 110. That is, during vapor deposition of the organic light-emitting layer 17, a vapor deposition angle of a vapor deposition source is adjusted, and the partition on the undercut structure 13 is used as a mask, so that a vapor deposition material of the vapor deposition source does not cover a part of the first auxiliary electrode 110 that is shielded by the partition. Therefore, the first auxiliary electrode 110 retains an area that can overlap with the cathode electrode 18.

Subsequently, a vapor deposition process is performed and the vapor deposition angle of the vapor deposition source is adjusted, so that a cathode material covers the entire undercut structure 13 during the vapor deposition process, and the cathode electrode 18 is connected to the first auxiliary electrode 110.

Figure 10:
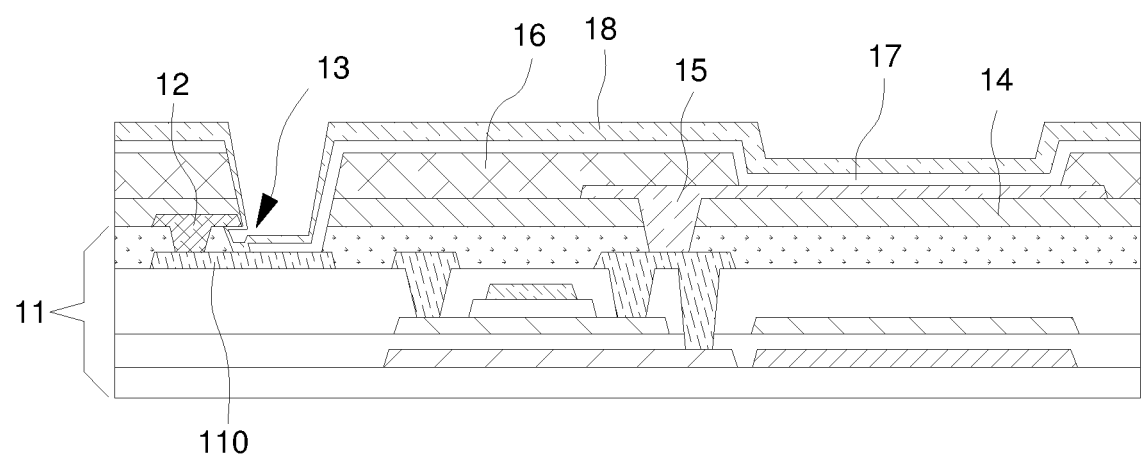
FIG. 10 is another schematic diagram of step S7 in the method for fabricating the display panel according to an embodiment of the present disclosure.

In some embodiments, please refer to FIG. 10, after the organic light-emitting layer 17 is formed, the cathode electrode 18 may also be formed on the organic light-emitting layer 17 by sputtering. Specifically, the undercut structure 13 also exposes the second auxiliary electrode 12. The cathode electrode 18 extends into the undercut structure 13 and is also connected to an exposed part of the second auxiliary electrode 12. Therefore, the cathode electrode 18 is a continuous layer.

The cathode electrode 18 is formed by sputtering, which increases a connection area between the cathode electrode 18 and the auxiliary electrode combination, thereby reducing connection resistance and improving production efficiency.

In the display panel 100 of the present disclosure, the first auxiliary electrode 110, the source electrode 111, and the drain electrode 112 are made of a same material.

The protective layer 113 is provided with a first via hole 114 exposing the first auxiliary electrode 110. The second auxiliary electrode 12 extends into the first via hole 114 and is connected to the first auxiliary electrode 110.

The flat layer 14 is provided with a second via hole 141 exposing the source electrode 111. The anode electrode 15 extends into the second via hole 141 and is connected to the source electrode 111. In some embodiments, the anode electrode 15 may be connected to the drain electrode 112. Whether the anode electrode 15 is connected to the source electrode 111 or the drain electrode 112 can be determined according to a type of thin film transistors, and will not be described in detail herein.

Furthermore, optionally, the flat layer 14 has a thickness of 1.0 µm to 4.0 µm, such as 1.0 µm, 2.0 µm, 3.0 µm, and 4.0 µm.

The pixel defining layer 16 is provided with a second opening 162 that exposes the anode electrode 15. The organic light-emitting layer 17 extends into the second opening 162.

Furthermore, the anode electrode 15 may be a single layer structure, such as a single layer of ITO, IZO, or WOx, or may be a composite layer structure, such as ITO/Ag/ITO, IZO/Ag/IZO, ITO/Al/ITO, or IZO/Al/IZO.

In the display panel 100 of this embodiment, the undercut structure 13 has a depth into the second auxiliary electrode 12 of 0.1 µm to 5 µm, such as 0.1 µm, 0.5 µm, 1 µm, 2 µm, 4 µm, and 5 µm. When the depth is less than 0.1 µm, the overlapping region between the cathode electrode 18 and the first auxiliary electrode 110 is too small, resulting in excessive impedance and reducing the effect of improving IR-drop. When the depth is greater than 5 µm, the second auxiliary electrode 12 may collapse.

Figure 2:
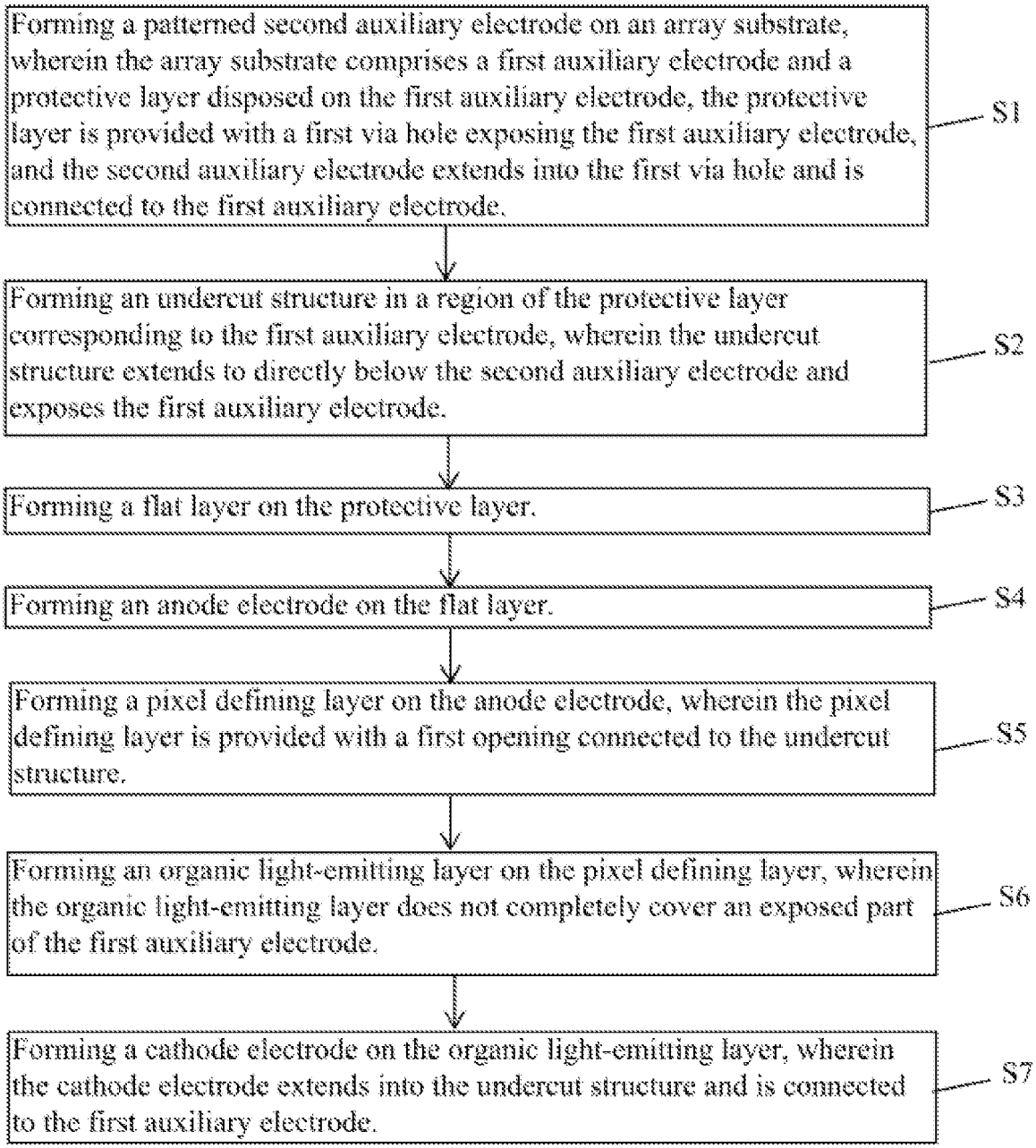
FIG. 2 is a schematic flowchart of a method for fabricating a display panel according to an embodiment of the present disclosure.

Please refer to FIG. 2, the present disclosure further provides a method for fabricating the display panel 100 of the above embodiment. The method comprises the following steps.

Step S1: forming a patterned second auxiliary electrode on an array substrate, wherein the array substrate comprises a first auxiliary electrode and a protective layer disposed on the first auxiliary electrode, the protective layer is provided with a first via hole exposing the first auxiliary electrode, and the second auxiliary electrode extends into the first via hole and is connected to the first auxiliary electrode.

Step S2: forming an undercut structure in a region of the protective layer corresponding to the first auxiliary electrode, wherein the undercut structure extends to directly below the second auxiliary electrode and exposes the first auxiliary electrode.

Step S3: forming a flat layer on the protective layer.

Step S4: forming an anode electrode on the flat layer.

Step S5: forming a pixel defining layer on the anode electrode, wherein the pixel defining layer is provided with a first opening connected to the undercut structure.

Step S6: forming an organic light-emitting layer on the pixel defining layer, wherein the organic light-emitting layer does not completely cover an exposed part of the first auxiliary electrode.

Step S7: forming a cathode electrode on the organic light-emitting layer, wherein the cathode electrode extends into the undercut structure and is connected to the first auxiliary electrode.

In the method for fabricating the display panel 100 of this embodiment, the undercut structure 13 is formed below the second auxiliary electrode 12, so that the subsequently formed cathode electrode 18 and the first auxiliary electrode 110 have an overlapping region, that is, the cathode electrode 18 and the first auxiliary electrode 110 are connected, thereby improving IR-drop of the display panel 100.

The method for fabricating the display panel 100 of this embodiment is described below.

Step S1: forming a patterned second auxiliary electrode 12 on an array substrate 11.

Figure 3:
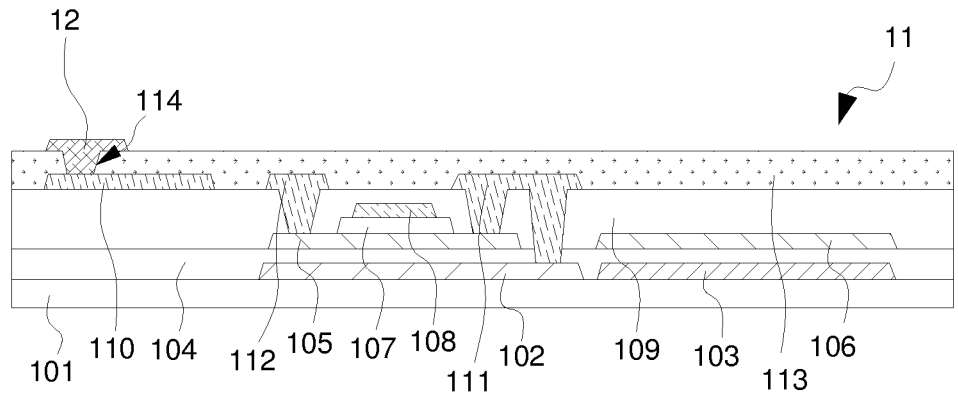
FIG. 3 is a schematic diagram of step S1 in the method for fabricating the display panel according to an embodiment of the present disclosure.

Specifically, please refer to FIG. 3, the array substrate 11 comprises a first auxiliary electrode 110 and a protective layer 113 disposed on the first auxiliary electrode 110. The protective layer 113 is provided with a first via hole 114 exposing the first auxiliary electrode 110. The second auxiliary electrode 12 extends into the first via hole 114 and is connected to the first auxiliary electrode 110.

In the embodiment shown in FIG. 3, the array substrate 11 comprises a base substrate 101, a light-shielding metal layer 102, a first electrode plate 103, a buffer layer 104, an amorphous oxide semiconductor layer 105, a second electrode plate 106, a gate insulating layer 107, a first metal conductive layer 108, a shield insulating layer 109, a first auxiliary electrode 110, a source electrode 111, a drain electrode 112, and a protective layer 113. The light-shielding metal layer 102 and the first electrode plate 103 are disposed on the base substrate 101. The buffer layer 104 is disposed on the light-shielding metal layer 102. The amorphous oxide semiconductor layer 105 and the second electrode plate 106 are disposed on the buffer layer 104. The gate insulating layer 107, the first metal conductive layer 108, and the shield insulating layer 109 are sequentially disposed on the amorphous oxide semiconductor layer 105. The shield insulating layer 109 covers the amorphous oxide semiconductor layer 105, the second electrode plate 106, the gate insulating layer 107, and the first metal conductive layer 108. The first auxiliary electrode 110, the source electrode 111, and the drain electrode 112 are disposed on the shield insulating layer 109. The protective layer 113 is disposed on the shield insulating layer 109, the first auxiliary electrode 110, the source electrode 111, and the drain electrode 112. The first electrode plate 103 and the second electrode plate 106 form a capacitor structure.

The first auxiliary electrode 110, the source electrode 111, and the drain electrode 112 are made of a same material.

On one hand, the second auxiliary electrode 12 and the first auxiliary electrode 110 are connected to form an auxiliary electrode combination. An area of the auxiliary electrode combination is increased to improve an effect of improving IR-drop. On the other hand, the second auxiliary electrode 12 provides direct support for an upper part of the undercut structure 13 to facilitate better formation of the subsequent layers and a partition mentioned below.

Optionally, the second auxiliary electrode 12 may be a single metal layer, such as Mo, Al, Cu, or Ti, or may be a multilayer structure, such as Mo/Al/Mo, Al/Mo, Mo/Cu, or Mo/Ti/Cu, but is not limited to the above materials. Furthermore, the second auxiliary electrode 12 has a thickness of 500 angstroms to 20000 angstroms, such as 500 angstroms, 1000 angstroms, 2000 angstroms, 5000 angstroms, 10000 angstroms, and 20000 angstroms.

Step S2: forming an undercut structure 13 in a region of the protective layer 113 corresponding to the first auxiliary electrode 110.

Figure 4:
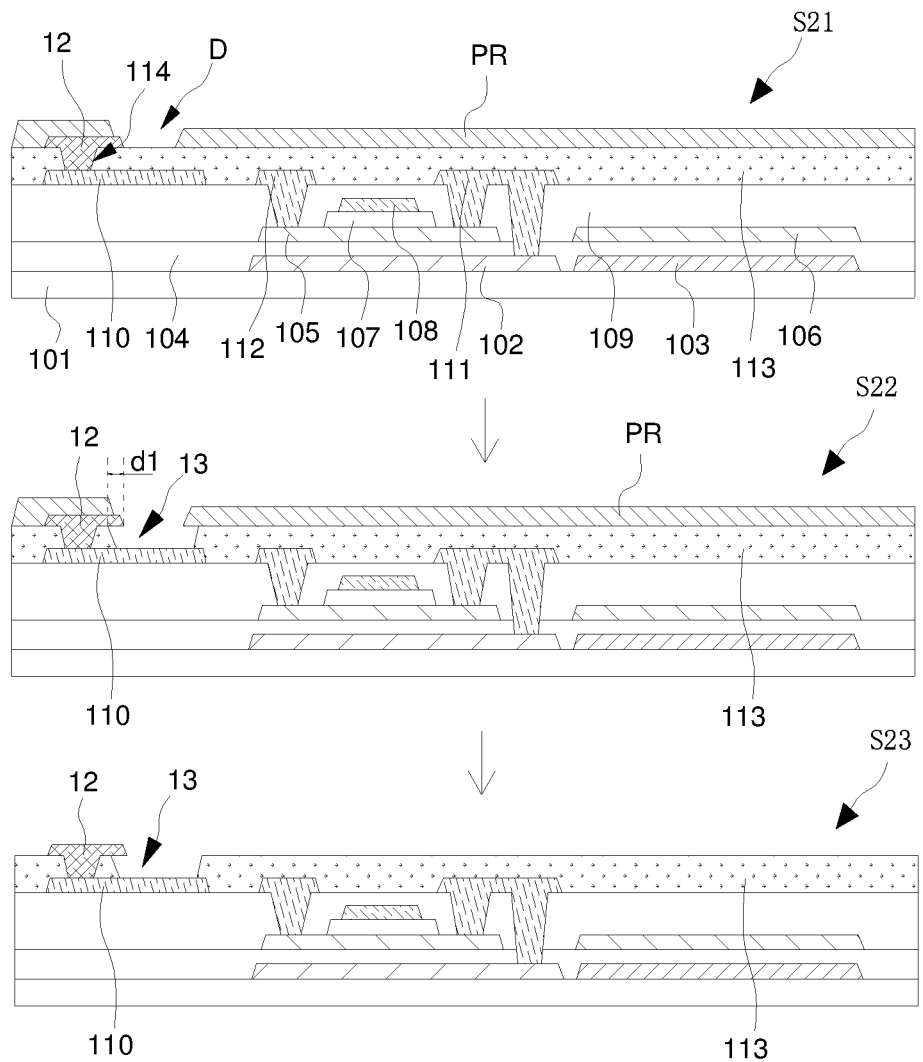
FIG. 4 is a schematic diagram of step S2 in the method for fabricating the display panel according to an embodiment of the present disclosure.

Specifically, please refer to FIG. 4, the undercut structure 13 extends to directly below the second auxiliary electrode 12 and exposes the first auxiliary electrode 110.

Step S2 comprises the following steps.

Step S21: forming a photoresist layer PR on the protective layer 113. The photoresist layer PR is provided with a notch D corresponding to an area where the undercut structure 13 is to be formed. The notch D exposes the protective layer 113.

In a region of the photoresist layer PR corresponding to the undercut structure 13 to be formed, the notch D is formed by a yellow light process.

Step S22: wet etching the protective layer 113 to form the undercut structure 13.

During wet etching, a depth d1 of the undercut structure 13 deep into the second auxiliary electrode 12 may be controlled by adjusting an etching time.

Optionally, the depth d1 of the undercut structure 13 deep into the second auxiliary electrode 12 is 0.1 μm to 5 μm, such as 0.1 μm, 0.5 μm, 1 μm, 2 μm, 4 μm, and 5 μm. When the depth d1 is less than 0.1 μm, the overlapping region between the cathode electrode 18 and the first auxiliary electrode 110 is too small, resulting in excessive impedance and reducing the effect of improving IR-drop. When the depth d1 is greater than 5 μm, the second auxiliary electrode 12 may collapse.

A size of the overlapping region between the cathode electrode 18 and the first auxiliary electrode 110 also depends on a vapor deposition angle of a vapor deposition source during a vapor deposition of the organic light-emitting layer 17. That is, the more a vapor deposition direction of the vapor deposition source is toward a part of the undercut structure 13 that is shielded by the second auxiliary electrode 12, the larger a coverage of the organic light-emitting layer 17 covering the first auxiliary electrode 110, and the smaller the overlapping region between the cathode electrode 18 and the first auxiliary electrode 110.

Step S23: removing the photoresist layer PR.

Subsequently, step S3 is performed.

Step S3: forming a flat layer 14 on the protective layer 113.

Figure 5:
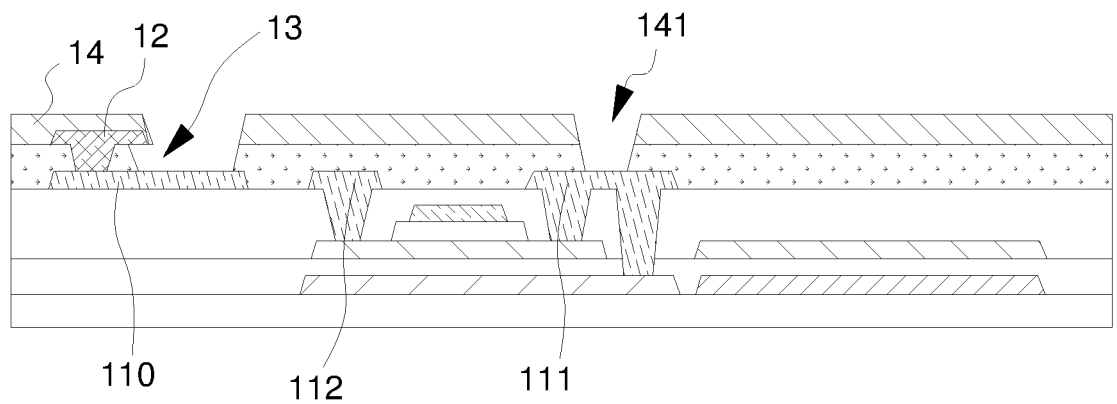
FIG. 5 is a schematic diagram of step S3 in the method for fabricating the display panel according to an embodiment of the present disclosure.

Specifically, please refer to FIG. 5, the patterned flat layer 14 is formed on the protective layer 113. The patterned flat layer 14 is provided with an opening corresponding to the undercut structure 13 and a second via hole 141 corresponding to the source electrode 111 and exposing the source electrode 111. The opening communicates with the undercut structure 13. A material of the flat layer 14 is not filled in the undercut structure 13.

Optionally, the flat layer 14 has a thickness of 1.0 μm to 4.0 μm, such as 1.0 μm, 2.0 μm, 3.0 μm, and 4.0 μm.

The flat layer 14 is a thin film or polyimide material deposited by chemical vapor deposition, or a combination of the thin film and the polyimide material. A patterning process comprises photoresist coating, exposure, development, and the like, but is not limited thereto.

Step S4: forming an anode electrode 15 on the flat layer 14.

Figure 6:
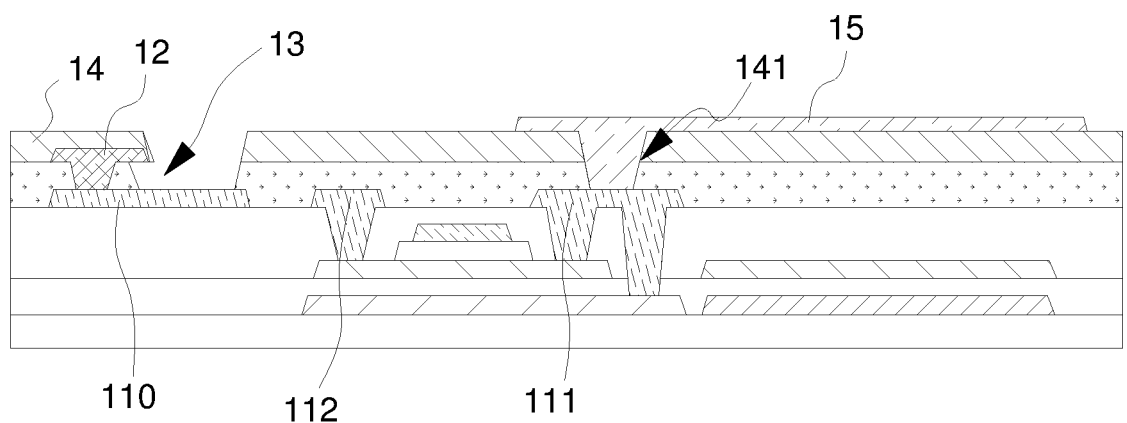
FIG. 6 is a schematic diagram of step S4 in the method for fabricating the display panel according to an embodiment of the present disclosure.

Specifically, please refer to FIG. 6, the anode electrode 15 is formed in a region of the flat layer 14 corresponding to the source electrode 111. The anode electrode 15 extends into the second via hole 141 and is connected to the source electrode 111. In some embodiments, the anode electrode 15 may be connected to the drain electrode 112. Whether the anode electrode 15 is connected to the source electrode 111 or the drain electrode 112 can be determined according to a type of thin film transistors, and will not be described in detail herein.

Optionally, the anode electrode 15 may be a single layer structure, such as a single layer of ITO, IZO, or WOx, or may be a composite layer structure, such as ITO/Ag/ITO, IZO/Ag/IZO, ITO/Al/ITO, or IZO/Al/IZO.

Step S5: forming a pixel defining layer 16 on the anode electrode 15.

Figure 7:
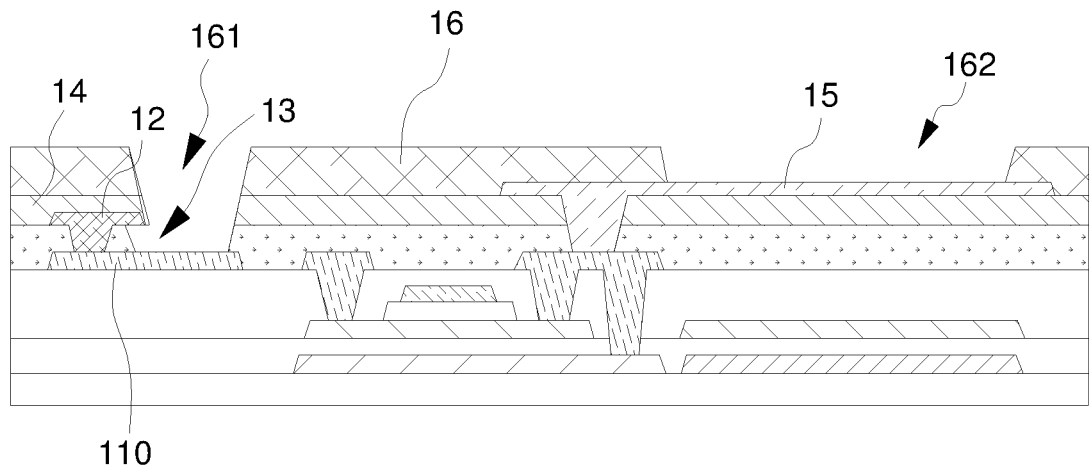
FIG. 7 is a schematic diagram of step S5 in the method for fabricating the display panel according to an embodiment of the present disclosure.

Specifically, please refer to FIG. 7, the pixel defining layer 16 is provided with a first opening 161 connected to the undercut structure 13 and a second opening 162 exposing the anode electrode 15. A material of the pixel defining layer 16 is not filled in the undercut structure 13.

Step S6: forming an organic light-emitting layer 17 on the pixel defining layer 16. The organic light-emitting layer 17 does not completely cover an exposed part of the first auxiliary electrode 110. The organic light-emitting layer 17 extends into the second opening 162.

Figure 8:
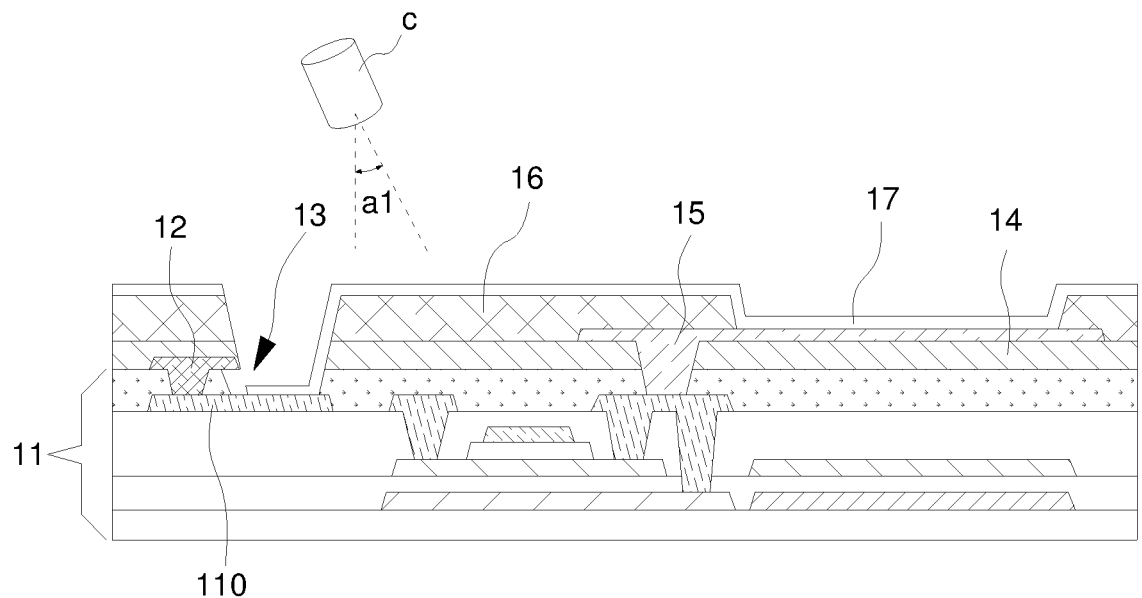
FIG. 8 is a schematic diagram of step S6 in the method for fabricating the display panel according to an embodiment of the present disclosure.

Please refer to FIG. 8, Step S6 comprises the following steps.

Step S61: adjusting a vapor deposition angle of a vapor deposition source c to a first set angle a1, so that the second auxiliary electrode 12 shields a part of the undercut structure 13 directly below the second auxiliary electrode 12 in the direction of the first set angle a1.

Optionally, the first set angle a1 is 0 degrees to 45 degrees in a counterclockwise direction, but is not limited thereto.

The specific degrees of the first set angle a1 may be determined according to a coverage of the organic light-emitting layer 17.

For example, as shown in FIG. 8, the undercut structure 13 is configured to make the second auxiliary electrode 12, the flat layer 14, and the pixel defining layer 16 stacked in a region corresponding to the undercut structure 13 form a partition. The partition causes the subsequent formed organic light-emitting layer 17 to be disconnected at the partition, thereby making the organic light-emitting layer 17 discontinuous. This provides a basis for the subsequent formed cathode electrode 18 to be directly connected to the first auxiliary electrode 110. That is, during vapor deposition of the organic light-emitting layer 17, a vapor deposition angle of a vapor deposition source is adjusted, and the partition on the undercut structure 13 is used as a mask, so that a vapor deposition material of the vapor deposition source does not cover a part of the first auxiliary electrode 110 that is shielded by the partition. Therefore, the first auxiliary electrode 110 retains an area that can overlap with the cathode electrode 18.

Furthermore, the more a vapor deposition direction of the vapor deposition source c is toward a part of the undercut structure 13 that is shielded by the second auxiliary electrode 12, the larger a coverage of the organic light-emitting layer 17 covering the first auxiliary electrode 110, and the smaller the overlapping region between the cathode electrode 18 and the first auxiliary electrode 110.

Subsequently, step S62 is performed.

Step S62: vapor depositing an organic light-emitting material on the pixel defining layer 16 to form the organic light-emitting layer 17. The organic light-emitting layer 17 extends into a part of the undercut structure 13 that is not shielded by the second auxiliary electrode 12.

Step S7: forming a cathode electrode 18 on the organic light-emitting layer 17. The cathode electrode 18 extends into the undercut structure 13 and is connected to the first auxiliary electrode 110.

Optionally, the cathode electrode 18 extends into the undercut structure 13 and is connected to the exposed part of the first auxiliary electrode 110.

Figure 9:
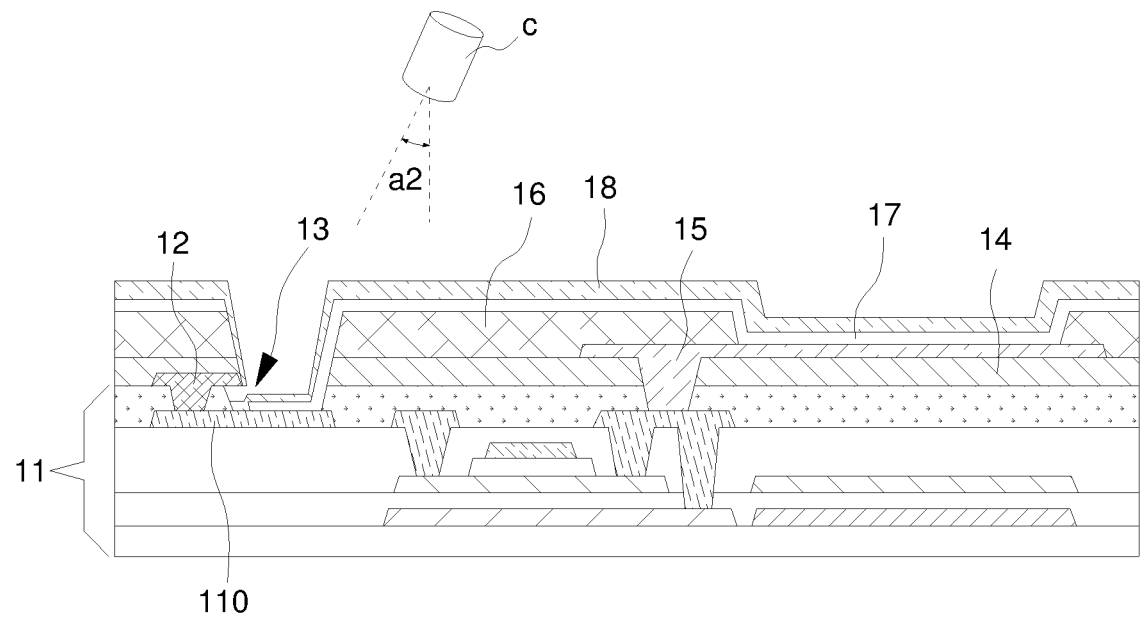
FIG. 9 is a schematic diagram of step S7 in the method for fabricating the display panel according to an embodiment of the present disclosure.

Specifically, please refer to FIG. 9, Step S7 comprises the following steps.

Step S71: adjusting the vapor deposition angle of the vapor deposition source c to a second set angle a2, so that the undercut structure 13 is completely exposed in a vapor deposition range of the evaporation source c.

Optionally, the second set angle a2 is 0 degrees to 45 degrees in a clockwise direction, but is not limited thereto. The specific degrees of the second set angle a2 may be determined according to a coverage of the cathode electrode 18.

Step S72: vapor depositing a conductive material on the organic light-emitting layer 17 to form the cathode electrode 18. The cathode electrode 18 extends into the undercut structure 13 and is connected to the exposed part of the first auxiliary electrode 110.

In some embodiments, please refer to FIG. 10, step S7 is forming a continuous cathode electrode 18 on the organic light-emitting layer 17. The cathode electrode 18 extends into the undercut structure 13 and is connected to the exposed part of the first auxiliary electrode 110 and an exposed part of the second auxiliary electrode 12.

Optionally, the cathode electrode 18 is formed by sputtering. The cathode electrode 18 is formed by sputtering, which increases a connection area between the cathode electrode 18 and the auxiliary electrode combination, thereby reducing connection resistance and improving production efficiency.

In this way, the method for fabricating the display panel 100 of this embodiment is completed.

In the display panel and the method for fabricating the same of the present disclosure, the undercut structure is formed below the second auxiliary electrode, so that the subsequently formed cathode electrode and the first auxiliary electrode have an overlapping region, thereby improving IR-drop of the display panel.

The display panel and the method for fabricating the same provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display panel, comprising:
   an array substrate comprising a source electrode, a drain electrode, a first auxiliary electrode, and a protective layer disposed on the first auxiliary electrode, wherein the first auxiliary electrode, the source electrode, and the drain electrode are formed of a same material on a same layer;
   a second auxiliary electrode disposed on the protective layer and connected to the first auxiliary electrode;
   an undercut structure formed on the protective layer, extending to directly below the second auxiliary electrode, and exposing the first auxiliary electrode;
   a flat layer disposed on the second auxiliary electrode and the protective layer;
   an anode electrode disposed on the flat layer;
   a pixel defining layer disposed on the anode electrode and the flat layer, and provided with a first opening connected to the undercut structure;
   an organic light-emitting layer disposed on the pixel defining layer and not completely covering an exposed part of the first auxiliary electrode; and
   a cathode electrode disposed on the organic light-emitting layer, extending into the undercut structure, and connected to the first auxiliary electrode;
   wherein the array substrate further comprises:
      a base substrate;
      a light-shielding metal layer disposed directly on the base substrate,
      a first electrode plate disposed directly on the base substrate, wherein the light-shielding metal layer and the first electrode plate are disposed in a same layer;
      a buffer layer disposed on the light-shielding metal layer and the first electrode plate;
      an amorphous oxide semiconductor layer disposed directly on the buffer layer; and
      a second electrode plate disposed directly on the buffer layer, wherein the amorphous oxide semiconductor layer and the second electrode plate are disposed in a same layer;
      wherein the first electrode plate and the second electrode plate form a capacitor structure;

wherein the undercut structure has a depth into the second auxiliary electrode of 0.1 μm to 1 μm.

2. The display panel according to claim 1, wherein the cathode electrode is connected to the second auxiliary electrode through the undercut structure.

3. The display panel according to claim 1, wherein
the protective layer is provided with a first via hole exposing the first auxiliary electrode, and the second auxiliary electrode extends into the first via hole and is connected to the first auxiliary electrode;
the flat layer is provided with a second via hole exposing the source electrode, and the anode electrode extends into the second via hole and is connected to the source electrode; and
the pixel defining layer is provided with a second opening that exposes the anode electrode, and the organic light-emitting layer extends into the second opening.

4. The display panel according to claim 1, wherein the second auxiliary electrode has a thickness of 500 angstroms to 20000 angstroms.

5. The display panel according to claim 1, wherein the anode electrode is a single layer structure or a composite layer structure.

6. A display panel, comprising:
an array substrate comprising a first auxiliary electrode and a protective layer disposed on the first auxiliary electrode;
a second auxiliary electrode disposed on the protective layer and connected to the first auxiliary electrode;
an undercut structure formed on the protective layer, extending to directly below the second auxiliary electrode, and exposing the first auxiliary electrode;
a flat layer disposed on the second auxiliary electrode and the protective layer;
an anode electrode disposed on the flat layer;
a pixel defining layer disposed on the anode electrode and the flat layer, and provided with a first opening connected to the undercut structure;
an organic light-emitting layer disposed on the pixel defining layer and not completely covering an exposed part of the first auxiliary electrode; and
a cathode electrode disposed on the organic light-emitting layer, extending into the undercut structure, and connected to the first auxiliary electrode;
wherein the array substrate further comprises:
a base substrate;
a light-shielding metal layer disposed directly on the base substrate,
a first electrode plate disposed directly on the base substrate, wherein the light-shielding metal layer and the first electrode plate are disposed in a same layer;
a buffer layer disposed on the light-shielding metal layer and the first electrode plate;
an amorphous oxide semiconductor layer disposed directly on the buffer layer; and
a second electrode plate disposed directly on the buffer layer, wherein the amorphous oxide semiconductor layer and the second electrode plate are disposed in a same layer;
wherein the first electrode plate and the second electrode plate form a capacitor structure;
wherein the undercut structure has a depth into the second auxiliary electrode of 0.1 μm to 1 μm.

7. The display panel according to claim 6, wherein the cathode electrode is connected to the second auxiliary electrode through the undercut structure.

8. The display panel according to claim 6, wherein the array substrate further comprises a source electrode and a drain electrode disposed on a same layer as the first auxiliary electrode.

9. The display panel according to claim 8, wherein
the protective layer is provided with a first via hole exposing the first auxiliary electrode, and the second auxiliary electrode extends into the first via hole and is connected to the first auxiliary electrode;
the flat layer is provided with a second via hole exposing the source electrode, and the anode electrode extends into the second via hole and is connected to the source electrode; and
the pixel defining layer is provided with a second opening that exposes the anode electrode, and the organic light-emitting layer extends into the second opening.

10. The display panel according to claim 6, wherein the anode electrode is a single layer structure or a composite layer structure.

11. The display panel according to claim 6, wherein the second auxiliary electrode has a thickness of 500 angstroms to 20000 angstroms.

12. A method for fabricating a display panel, comprising:
forming a patterned second auxiliary electrode on an array substrate, wherein the array substrate comprises a first auxiliary electrode and a protective layer disposed on the first auxiliary electrode, the protective layer is provided with a first via hole exposing the first auxiliary electrode, and the second auxiliary electrode extends into the first via hole and is connected to the first auxiliary electrode;
forming an undercut structure in a region of the protective layer corresponding to the first auxiliary electrode, wherein the undercut structure extends to directly below the second auxiliary electrode and exposes the first auxiliary electrode;
forming a flat layer on the protective layer;
forming an anode electrode on the flat layer;
forming a pixel defining layer on the anode electrode, wherein the pixel defining layer is provided with a first opening connected to the undercut structure;
forming an organic light-emitting layer on the pixel defining layer, wherein the organic light-emitting layer does not completely cover an exposed part of the first auxiliary electrode; and
forming a cathode electrode on the organic light-emitting layer, wherein the cathode electrode extends into the undercut structure and is connected to the first auxiliary electrode;
wherein the array substrate further comprises:
a base substrate;
a light-shielding metal layer disposed directly on the base substrate,
a first electrode plate disposed directly on the base substrate, wherein the light-shielding metal layer and the first electrode plate are disposed in a same layer;
a buffer layer disposed on the light-shielding metal layer and the first electrode plate;
an amorphous oxide semiconductor layer disposed directly on the buffer layer; and
a second electrode plate disposed directly on the buffer layer, wherein the amorphous oxide semiconductor layer and the second electrode plate are disposed in a same layer;
wherein the first electrode plate and the second electrode plate form a capacitor structure;

wherein the undercut structure has a depth into the second auxiliary electrode of 0.1 μm to 1 μm.

13. The method for fabricating the display panel according to claim 12, wherein the step of forming the undercut structure in the region of the protective layer corresponding to the first auxiliary electrode comprises:
forming a photoresist layer on the protective layer, wherein the photoresist layer is provided with a notch corresponding to an area where the undercut structure is to be formed, and the notch exposes the protective layer;
etching the protective layer to form the undercut structure; and
removing the photoresist layer.

14. The method for fabricating the display panel according to claim 13, wherein the step of forming the organic light-emitting layer on the pixel defining layer comprises:
shielding a part of the undercut structure directly below the second auxiliary electrode with the second auxiliary electrode in a direction of a first set angle; and
forming the organic light-emitting layer on the pixel defining layer, wherein the organic light-emitting layer extends into a part of the undercut structure that is not shielded by the second auxiliary electrode.

15. The method for fabricating the display panel according to claim 14, wherein in the step of forming the cathode electrode on the organic light-emitting layer, the cathode electrode extends into the undercut structure and is connected to the exposed part of the first auxiliary electrode.

16. The method for fabricating the display panel according to claim 14, wherein the step of forming the cathode electrode on the organic light-emitting layer comprises:
forming a continuous cathode electrode on the organic light-emitting layer, wherein the cathode electrode extends into the undercut structure and is connected to the exposed part of the first auxiliary electrode and an exposed part of the second auxiliary electrode.

17. The method for fabricating the display panel according to claim 12, wherein
the array substrate further comprises a source electrode and a drain electrode disposed on a same layer as the first auxiliary electrode;
the flat layer is provided with a second via hole exposing the source electrode;
the anode electrode extends into the second via hole and is connected to the source electrode;
the pixel defining layer is provided with a second opening that exposes the anode electrode; and
the organic light-emitting layer extends into the second opening.

\* \* \* \* \*